(12) United States Patent
Mittal et al.

(10) Patent No.: US 10,817,223 B1
(45) Date of Patent: Oct. 27, 2020

(54) UNIFIED CHIP ENABLE, ADDRESS AND COMMAND LATCH ENABLE PROTOCOL FOR NAND MEMORY

(71) Applicant: SANDISK TECHNOLOGIES LLC, Addison, TX (US)

(72) Inventors: Sajal Mittal, Bangalore (IN); Sneha Bhatia, Gurgaon (IN); Vinayak Ghatawade, Bangalore (IN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/414,708

(22) Filed: May 16, 2019

(51) Int. Cl.
*G06F 3/06* (2006.01)
*H03K 19/20* (2006.01)
*G11C 16/04* (2006.01)
*G11C 16/08* (2006.01)

(52) U.S. Cl.
CPC .......... *G06F 3/0659* (2013.01); *G06F 3/0604* (2013.01); *G06F 3/0656* (2013.01); *G06F 3/0679* (2013.01); *G11C 16/0483* (2013.01); *G11C 16/08* (2013.01); *H03K 19/20* (2013.01)

(58) Field of Classification Search
CPC ... G06F 3/0659; G11C 16/08; G11C 2216/30; H03K 19/20
See application file for complete search history.

(56) References Cited

U.S. PATENT DOCUMENTS

| | | | |
|---|---|---|---|
| 7,688,628 B2 * | 3/2010 | Grimsrud | G06F 13/4072 365/185.11 |
| 8,447,917 B2 | 5/2013 | Chen et al. | |
| 8,825,939 B2 | 9/2014 | Oh et al. | |
| 9,654,105 B2 | 5/2017 | Kim | |
| 2005/0135145 A1 | 6/2005 | Lee et al. | |

OTHER PUBLICATIONS

Wikipedia, Binary Decoder, Sep. 2015, retrieved from https://web.archive.org/web/20150907173810/https://en.wikipedia.org/wiki/Binary_decoder, 2 pages. (Year: 2015).*
Wikipedia, Digital Buffer, Jan. 2018, retrieved from https://web.archive.org/web/20180107205751/https://en.wikipedia.org/wiki/Digital_buffer (Year: 2018).*

* cited by examiner

*Primary Examiner* — Gary W. Cygiel
(74) *Attorney, Agent, or Firm* — Vierra Magen Marcus LLP

(57) ABSTRACT

A memory device includes receiving, by a memory module, a first combined signal and a second combined signal from a memory controller and decoding, by the memory module, the first combined signal and the second combined signal to obtain a first chip enable signal, a first address latch enable signal, and a first command latch enable signal. Upon decoding, the first command latch enable signal and the first address latch enable signal are received substantially simultaneously as the first chip enable signal to reduce a setup time.

19 Claims, 6 Drawing Sheets

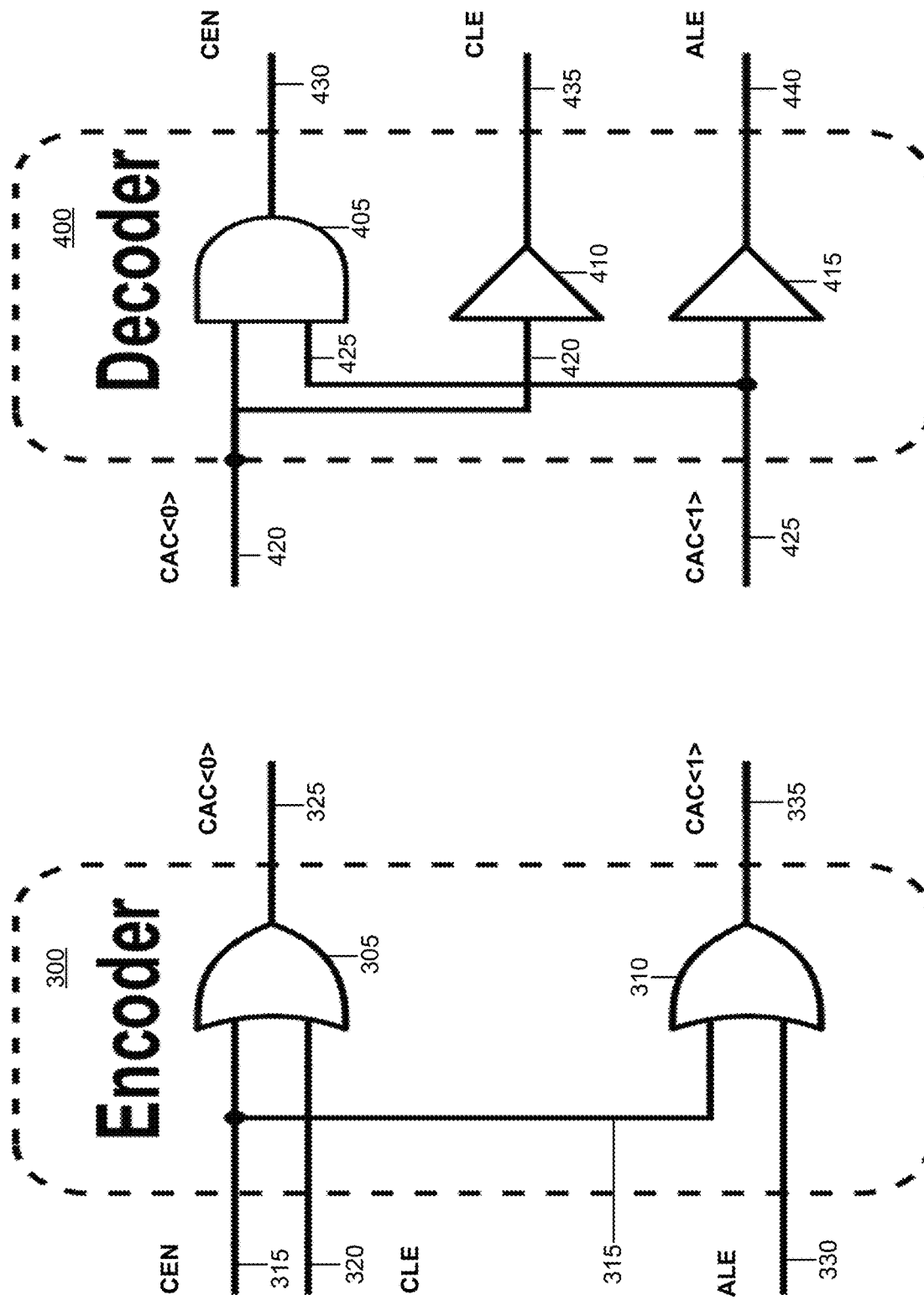

UNIFIED CHIP ENABLE, ADDRESS AND COMMAND LATCH ENABLE PROTOCOL FOR NAND MEMORY

BACKGROUND

The following description is provided to assist the understanding of the reader. None of the information provided or references cited is admitted to be prior art.

Computing techniques for processing data generally require copying executable code and data from a non-volatile memory array into a volatile memory before applying the executable code to the data. The results of the processing are then returned to the non-volatile memory array. Reading information (e.g., data and executable code) from or writing information (e.g., data) to the non-volatile memory array occurs by communication between a memory controller and a memory module of the non-volatile memory array. However, the present day techniques for communication between the memory controller and the memory module have limitations.

SUMMARY

In accordance with some aspects of the present disclosure, a non-transitory computer-readable media having computer-readable instructions stored thereon is disclosed. The instructions when executed cause a processor to encode a first chip enable signal, a first address latch enable signal, and a first command latch enable signal to obtain a first combined signal and a second combined signal at a memory controller, and decode the first combined signal and the second combined signal at a memory module to obtain a second chip enable signal, a second address latch enable signal, and a second command latch enable signal.

In accordance with some other aspects of the present disclosure, a method is disclosed. The method includes receiving, by a memory module, a first combined signal and a second combined signal from a memory controller, and decoding, by the memory module, the first combined signal and the second combined signal to obtain a second chip enable signal, a second address latch enable signal, and a second command latch enable signal. Upon decoding, the second command latch enable signal and the second address latch enable signal are received substantially simultaneously as the second chip enable signal.

In accordance with yet other aspects of the present disclosure, a memory device is disclosed. The memory device includes a memory controller having an encoder. The encoder performs a first logical OR operation between a first chip enable signal and a first command latch enable signal to obtain a first combined signal and a second logical OR operation between the first chip enable signal and a first address latch enable signal to obtain a second combined signal. The memory device also includes a memory module having a decoder. The decoder performs a first buffer operation on the first combined signal to obtain a second command latch enable signal, a second buffer operation on the second combined signal to obtain a second address latch enable signal, and a first logical AND operation between the first combined signal and the second combined signal to obtain a second chip enable signal.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

FIG. 3 is an example block diagram of an encoder associated with the memory controller of FIG. 2, in accordance with some embodiments of the present disclosure.

FIG. 4 is an example block diagram of a decoder associated with the memory module of FIG. 2, in accordance with some embodiments of the present disclosure.

Figure 1:
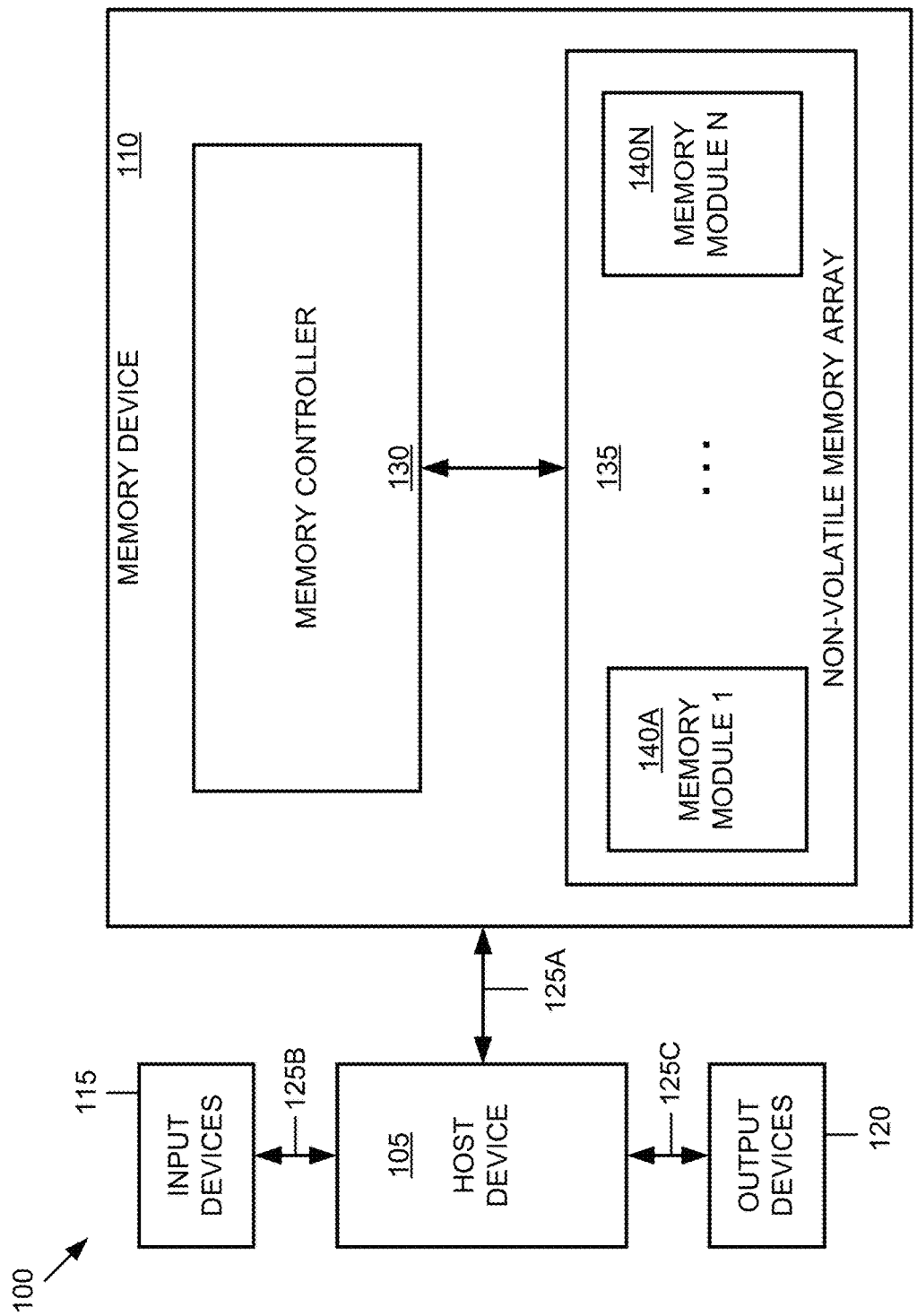
FIG. 1 is an example block diagram of a computing system, in accordance with some embodiments of the present disclosure.

The foregoing and other features of the present disclosure will become apparent from the following description and appended claims, taken in conjunction with the accompanying drawings. Understanding that these drawings depict only several embodiments in accordance with the disclosure and are therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

The present disclosure is directed to a computing system having a memory device. The memory device includes a memory controller in communication with one or more memory modules. The memory controller is configured to read data from or write data to the one or more memory modules. To communicate with a first memory module of the one or more memory modules, the memory controller and the first memory module are connected via a plurality of pads (also referred to herein as "pins") and communication buses. For example, the memory controller and the first memory module may each be connected via a Chip Enable ("CEN") pad, an Address Latch Enable ("ALE") pad, a Command Latch Enable ("CLE") pad, and an Input/Output ("I/O") pad. The pads on the memory controller may be referred to as transmitter pads, while the pads on the first memory module may be referred to as receiver pads.

To communicate with the first memory module, the memory controller selects the first memory module by asserting a CEN signal that is transmitted from the memory controller to the memory module via their respective CEN pads. Additionally, the memory controller may assert an ALE signal, a CLE signal, and an I/O signal to send address, commands, and data to the first memory module via their respective ALE, CLE and, I/O pads. The first memory module does not respond to control signals from the memory controller until the CEN signal is asserted. The first memory module starts responding to the control signals received from the memory controller after the CEN signal is asserted. Thus, when the first memory module receives the asserted CEN signal, the first memory module activates (e.g., wakes up from standby) the ALE/CLE receiver pads to receive the ALE/CLE signals. There is a time lag between the assertion of the CEN signal and the activation of the ALE/CLE receiver pads at the first memory module for receiving the ALE/CLE signals from the memory controller. This time lag contributes to an overall setup time and is undesirable.

Specifically, the ALE/CLE signals form the command/address path of the first memory module. The command/address path operates at a lower frequency (e.g., a write cycle time of about 20 nanoseconds and 50 MHz) compared to data transfer speeds, partly due to the overall setup time. Data transfer speeds have been constantly increasing, while command/address path speeds have largely remained stagnant, further increasing the gap between command/address path speeds and data transfer speeds. The command/address path speeds may become a bottleneck, particularly in those applications that require reading or writing a burst of data (e.g., video, real time imaging, etc.). Without increasing the command/address path speeds, the speed with which data operations may be performed is ultimately limited regardless of how fast the data may be read from or written into the first memory module. Thus, the command/address path speed limits the overall bandwidth (e.g., throughput) with which data operations may be performed, which in turn impacts performance of the first memory module.

By eliminating or at least reducing the overall setup time, the command/address path speed may be increased. Accordingly, the present disclosure provides technical solutions for eliminating or at least substantially reducing the overall setup time. Specifically, the present disclosure provides technical solutions for reducing the time lag between the assertion of the CEN signal and the receipt of the ALE/CLE signals at the first memory module.

Therefore, the present disclosure provides a mechanism by which the CEN, ALE, and CLE signals are received simultaneously or substantially simultaneously at the first memory module, thereby eliminating or substantially reducing the time lag between the assertion of the CEN signal and the receipt of the ALE/CLE signals. To receive the CEN, ALE, and CLE signals simultaneously or substantially simultaneously at the first memory module, the memory controller encodes the CEN, ALE, and CLE signals into a first combined signal and a second combined signal. Instead of transmitting the CEN, ALE, and CLE signals to the first memory module, the memory controller sends the first combined signal and the second combined signal to the first memory module. The first memory module decodes the first combined signal and the second combined signal to regenerate the CEN, ALE, and CLE signals.

The regenerated CEN, ALE, and CLE signals have the same or substantially similar attributes as the encoded CEN, ALE, and CLE signals. The first memory module regenerates the CEN, ALE, and CLE signals simultaneously or substantially simultaneously such that the first memory module receives the regenerated CEN, ALE, and CLE signals simultaneously or substantially simultaneously, thereby eliminating or at least substantially reducing the time lag between the assertion of the CEN signal and the receipt of the ALE/CLE signals. Reducing the time lag reduces the overall setup time and increases the command/address path speed.

In some embodiments, the pads (e.g., the receiver pads) of the first combined signal and the second combined signal at the first memory module may need to remain continuously activated, such that the first combined signal and the second combined signal received from the memory controller may be instantaneously or substantially instantaneously decoded to regenerate the CEN, ALE, and CLE signals simultaneously or substantially simultaneously, and so that the first memory module need not spend any extra time to first activate the receiver pads of the first combined signal and the second combined signal before decoding. Keeping the receiver pads of the first combined signal and the second combined signal activated all the time may slightly increase power consumption of the first memory module. However, keeping the receiver pads activated all the time reduces the time lag between the assertion of the CEN signal and receiving of the CLE/ALE signals. By reducing the time lag, the command/address path speed increases, thereby reducing the overall setup time and increasing the performance of the first memory module. Such increase in performance may offset the slight increase in the power consumption of the first memory module.

Advantageously, reducing the overall setup time reduces data access times, thereby increasing system throughout. The reduced overall setup time may be particularly advantageous for memory devices such as low latency flash memories having high data access speeds but slower command/address path speeds. Further, by sending the first combined signal and the second combined signal to the first memory module instead of the separate CEN, ALE, and CLE signals, the memory controller and the first memory module do not need separate CEN, ALE, and CLE pads. Rather, the memory controller and the first memory module each only need a pad for the first combined signal and a pad for the second combined signal. Thus, both the memory controller and the first memory module have one less pad, which saves area on the memory die, allows the memory die to be more compact, and reduces the cost of manufacturing the memory die.

Referring now to FIG. 1, an example block diagram of a computing system 100 is shown, in accordance with some embodiments of the present disclosure. The computing system 100 includes a host device 105 associated with a memory device 110. The host device 105 may be configured to receive input from one or more input devices 115, and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, etc.), tablets, personal digital assistants, mobile devices, wearable computing devices such as smart watches, other handheld or portable devices, or any other computing unit suitable for performing operations using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user, to enter information (e.g., data) into the host device and send instructions to the host device. Similarly, the output devices 120 may include a variety of output technologies such as external memories, printers, speakers, displays, microphones, light emitting diodes, headphones, plotters, speech generating devices, video devices, global positioning systems, and any other output peripherals that are configured to receive information (e.g., data) from the host device 105. The "data" that is either input into the host device 105 and/or output from the host device may include any of a variety of textual data, graphical data, video data, sound data, position data, combinations thereof, or other types of analog and/or digital data that is suitable for processing using the computing system 100.

Although not shown, the host device 105 may include one or more processing units that may be configured to execute instructions for running one or more applications. In some embodiments, the instructions and data needed to run the one or more applications may be stored within the memory device 110. In such cases, the host device 105 may request the memory device 110 to retrieve the data and instructions, which may then at least temporarily be stored within a memory on the host device. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

The memory device 110 includes a memory controller 130 that may be configured to read data from or write data to a non-volatile memory array 135. The non-volatile memory array 135 may include one or more memory modules such as memory modules 140A-140N. Each of the memory modules 140A-140N may include any of a variety of non-volatile memory types. For example, in some embodiments, one or more of the memory modules 140A-140N may include NAND flash memory cores. In other embodiments, one or more of the memory modules 140A-140N may include NOR flash memory cores, Static Random Access Memory (SRAM) cores, Dynamic Random Access Memory (DRAM) cores, Magnetoresistive Random Access Memory (MRAM) cores, Phase Control Memory (PCM) cores, Resistive Random Access Memory (ReRAM) cores, 3D XPoint memory cores, ferroelectric random-access memory (FeRAM) cores, and other types of memory cores that are suitable for use within the non-volatile memory array 135.

The memory modules 140A-140N may be individually and independently controlled by the memory controller 130. In other words, the memory controller 130 may be configured to communicate with each of the memory modules 140A-140N individually and independently. As discussed in greater detail below, the memory modules 140A-140N may remain in a standby state until the memory controller 130 desires to establish communication with one of the memory modules by generating a chip select or chip enable signal. The memory controller 130 may be configured as a logical block or circuitry that receives instructions from the host device 105 and performs operations in accordance with those instructions. For example, the memory controller 130 may be configured to read data from or write data to one or more of the memory modules 140A-140N. The memory controller 130 may be situated on the same die as the non-volatile memory array 135 or on a different die.

It is to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 130 and the non-volatile memory array 135, may include other hardware, software, and/or firmware components that are considered necessary or desirable in performing the functions described herein.

Figure 2:
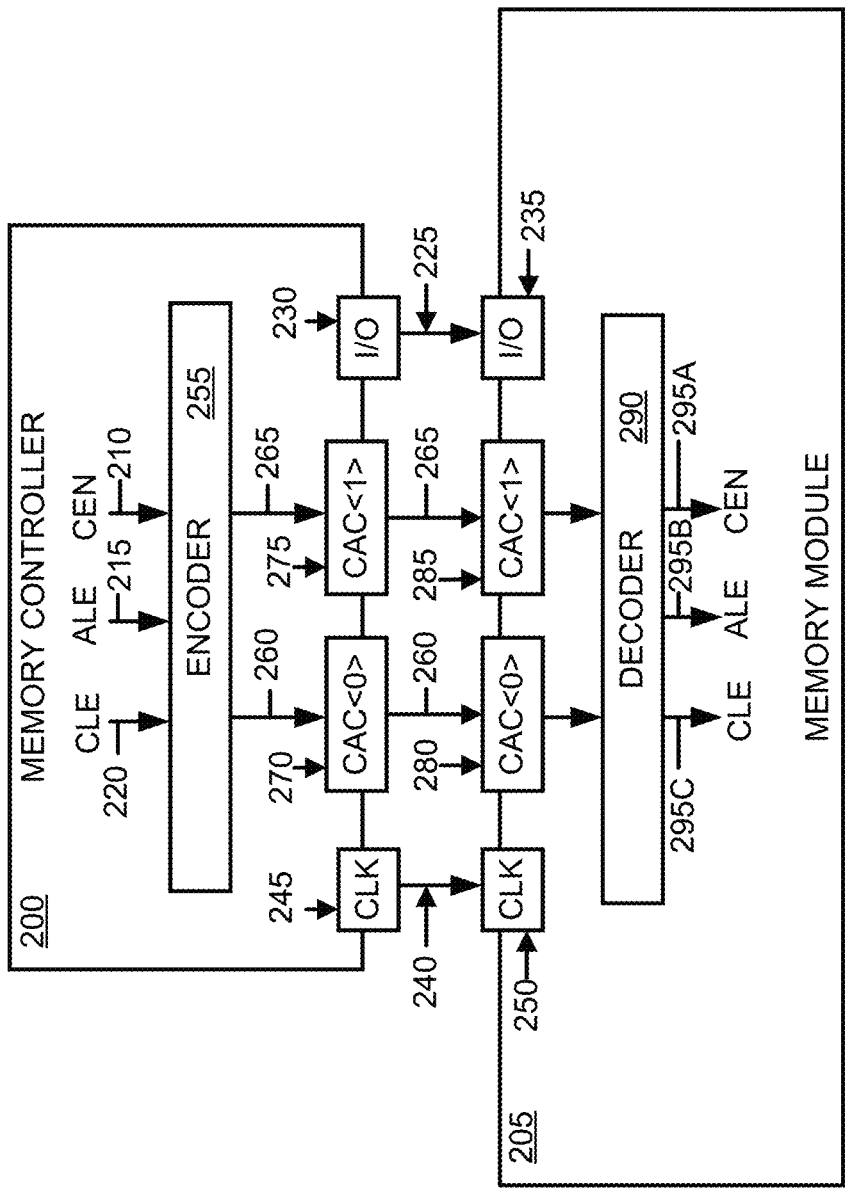
FIG. 2 is an example block diagram showing a memory controller and a memory module of the computing system of FIG. 1 in greater detail, in accordance with some embodiments of the present disclosure.

Turning now to FIG. 2, a memory controller 200 in communication with a memory module 205 is shown, in accordance with some embodiments of the present disclosure. The memory controller 200 is similar to the memory controller 130 of FIG. 1 and the memory module 205 is similar to one of the memory modules 140A-140N of FIG. 1. Although the memory controller 200 has been shown as communicating with the memory module 205 only, it is to be understood that the memory controller is likewise configured to establish communication with each of the memory modules in the associated non-volatile memory array (e.g., the non-volatile memory array 135). The memory controller 200 includes logic/circuitry to select one of the memory modules (e.g., the memory module 205) to perform an operation, and upon selecting the memory module, send command, address, and data information to the memory module for performing the operation. Thus, to communicate with the memory module 205, the memory controller 200 generates a plurality of signals.

For example, the memory controller 200 may generate a Chip Enable ("CEN") signal 210 (also referred to herein as a "Chip Select" signal) to activate or select the memory module 205 for communication. As discussed above, the non-volatile memory array (e.g., the non-volatile memory array 135) may include a plurality of memory modules (e.g., the memory modules 140A-140N). The memory modules that are not being used may remain in a standby state to save power. In the standby state, the memory modules do not respond to any control signals from the memory controller. When a memory module is desired to be activated, the memory controller asserts a CEN signal. After asserting the CEN signal, the activated memory module starts responding to the control signals from the memory controller.

Thus, when the memory controller 200 desires to activate the memory module 205, the memory controller generates the CEN signal 210. In some embodiments, the CEN signal 210 is an active low signal, which means that the CEN signal is active or asserted at a logic LOW level (e.g., logic level 0 or low voltage (0 volt)) and inactive at a logic HIGH level (e.g., logic level 1 or high voltage (e.g., 5 volts)). Thus, when no communication is desired with the memory module 205, the CEN signal 210 may remain in an inactive or logic HIGH level. To activate the memory module 205, the memory controller 200 may toggle the CEN signal 210 from a logic HIGH level to a logic LOW level. In other embodiments, the CEN signal 210 may be an active high signal in which the CEN signal may be active in a logic HIGH level.

The memory controller 200 may also generate an address latch enable ("ALE") signal 215 and a command latch enable ("CLE") signal 220. The ALE signal 215 is a control signal, which may be used to activate an address bus connected between the memory controller 200 and the memory module 205. The CLE signal 220 is a control signal, which may be used to activate a command bus between the memory controller 200 and the memory module 205. In some embodiments, the ALE signal 215 and the CLE signal 220 may be active high signals. In other words, in some embodiments, the ALE signal 215 and the CLE signal 220 may be asserted at a logic HIGH level and may be inactive at a logic LOW level. The combination of the ALE signal 215 and the CLE signal 220 may be used to send command, address, or data to the memory module 205. For example, in some embodiments, the ALE signal 215 and the CLE signal 220 may be implemented in accordance with Truth Table 1 below:

| Truth Table 1 | | |
| --- | --- | --- |
| ALE | CLE | OPERATION |
| 0 | 0 | DATA |
| 0 | 1 | COMMAND |
| 1 | 0 | ADDRESS |
| 1 | 1 | INVALID |

Thus, when the memory module 205 receives the ALE signal 215 and the CLE signal 220 that are both at logic LOW levels, the memory module knows that data is being sent by the memory controller 200 and that data is latched into an input/output register of the memory module. When the memory module 205 receives the ALE signal 215 that is at a logic LOW level and the CLE signal 220 that is at a logic HIGH level, the memory module knows that the memory controller 200 is sending a command, which is latched into a command register of the memory module 205. Similarly, when the memory module 205 receives the ALE signal 215 at a logic HIGH level and the CLE signal 220 at a logic LOW level, the memory module knows that an address is being sent by the memory controller 200 and the address is latched into an address register of the memory module. The ALE signal 215 and the CLE signal 220 both being at a logic HIGH level is considered an invalid event, which the memory controller 200 may resolve on its own without sending to the memory module 205. Thus, by toggling the ALE signal 215 and the CLE signal 220, the memory controller 200 may send address, data, and commands to the memory module 205.

The memory controller 200 also generates an input/output (I/O) signal 225 for sending data, as well as command codes and address values to the memory module 205. The information sent on the I/O signal 225 is latched into an appropriate register (e.g., input/output register, address register, command register) within the memory module 205 based upon the logic levels of the ALE signal 215 and the CLE signal 220. The I/O signal 225 may be sent via a transmitter I/O pad or pin 230 on the memory controller 200 to a receiver I/O pad or pin 235 on the memory module 205.

Further, the CEN signal 210, the ALE signal 215, the CLE signal 220, and the I/O signal 225 may be clock synchronous signals such that the state of each of those signals change or toggle with respect to a rising or falling edge of a clock signal. Thus, the memory controller 200 may generate a CLK signal 240, which may be sent via a transmitter clock pad or pin 245 on the memory controller to a receiver clock pad or pin 250 on the memory module 205. In some embodiments, the CLK signal 240 may be a write enable ("WE") clock signal, particularly when a write operation is to be performed on the memory module 205. Although only the CEN signal 210, the ALE signal 215, the CLE signal 220, the I/O signal 225, and the CLK signal 240 are discussed herein, the memory controller 200 may include additional signals that may be needed or considered desirable to facilitate communication between the memory controller 200 and the memory module 205. Further, in some embodiments, each of the CEN signal 210, the ALE signal 215, and the CLE signal 220 may be a one-bit wide signal, while the I/O signal 225 may be an 8-bit wide signal. In other embodiments, the CEN signal 210, the ALE signal 215, the CLE signal 220, and the I/O signal 225 may have other bit-widths.

The memory controller 200 further includes an encoder 255 that is configured to encode the CEN signal 210, the ALE signal 215, and the CLE signal 220, and generate two output signals—a first combined signal 260 and a second combined signal 265. The encoder 255 is discussed in greater detail in FIG. 3 below. The first combined signal 260 and the second combined signal 265 are each one-bit command-address-chip enable (CAC<0> and CAC<1>) control signals, which are sent via transmitter CAC pads or pins 270 and 275, respectively, on the memory controller 200. The first combined signal 260 and the second combined signal 265 are received via receiver CAC pads or pins 280 and 285, respectively, on the memory module 205. Although the encoder 255 is shown within the memory controller 200, in some embodiments, the encoder may be separate from and associated with the memory controller for operation.

In the memory module 205, the first combined signal 260 and the second combined signal 265 are decoded by a decoder 290. Although the decoder 290 is shown within the memory module 205, in some embodiments, the decoder may be separate from and associated with the memory module for operation. The decoder 290 is discussed in greater detail in FIG. 4 below. The decoder 290 receives the first combined signal 260 and the second combined signal 265 as inputs to generate three output signals: a CEN signal 295A, an ALE signal 295B, and a CLE signal 295C. The CEN signal 295A, the ALE signal 295B, and the CLE signal 295C have same or substantially similar attributes (e.g., active low/active high, duty cycle, frequency, etc.) as the CEN signal 210, the ALE signal 215, and the CLE signal 220, respectively. The decoder 290 decodes the first combined signal 260 and the second combined signal 265 simultaneously or substantially simultaneously to generate the CEN signal 295A, the ALE signal 295B, and the CLE signal 295C simultaneously or substantially simultaneously.

By decoding the first combined signal 260 and the second combined signal 265 to generate the CEN signal 295A, the ALE signal 295B, and the CLE signal 295C simultaneously or substantially simultaneously, the memory module 205 receives the CEN signal, the ALE signal, and the CLE signal simultaneously or substantially simultaneously. By receiving the CEN signal 295A, the ALE signal 295B, and the CLE signal 295C simultaneously or substantially simultaneously, the time lag between the assertion of the CEN signal 295A and the receipt of the ALE signal 295B and the CLE signal 295C may be eliminated or at least substantially reduced.

Further, by combining (e.g., encoding) the CEN signal 210, the ALE signal 215, and the CLE signal 220 into the first combined signal 260 and the second combined signal 265, the memory controller 200 needs to send only two signals (e.g., the first combined signal and the second combined signal) to the memory module 205 instead of the three signals (CEN, ALE, and CLE signals). By reducing the number of signals being sent from the memory controller 200 to the memory module 205, the number of pads or pins needed on each of the memory controller and the memory module is reduced by one, leading to reduced area of the memory die and reduced cost of manufacturing.

Referring to FIG. 3, an example logic diagram of an encoder 300 is shown, in accordance with some embodiments of the present disclosure. The encoder 300 is associated with a memory controller (e.g., the memory controller 200) and is similar to the encoder 255 of FIG. 2. The encoder 300 is configured to receive three signals as input, encode the three signals, and generate two signals as output. Thus, in some embodiments, the encoder 300 may include a first OR gate 305 and a second OR gate 310. The first OR gate 305 and the second OR gate 310 each implement a logical disjunction on two input signals to generate one output signal. The first OR gate 305 and the second OR gate 310 may operate in accordance with Truth Table 2:

| Truth Table 2 | | |
| --- | --- | --- |
| INPUT A | INPUT B | OUTPUT |
| 0 | 0 | 0 |
| 0 | 1 | 1 |
| 1 | 0 | 1 |
| 1 | 1 | 1 |

Thus, the first OR gate 305 and the second OR gate 310 generate a logic HIGH level (e.g., logic level "1") output when at least one of the inputs are at a logic HIGH level, and generate a logic LOW level (e.g., logic level "0") when both the inputs are at logic LOW levels. Specifically, the first OR gate 305 receives a CEN signal 315 as the first input and a CLE signal 320 as the second input, and generates a first combined signal 325 (CAC<0>) as the output. The first combined signal 325 is at a logic HIGH level when either the CEN signal 315 or the CLE signal 320 are at a logic HIGH level. The first combined signal 325 is at a logic LOW level when both the CEN signal 315 and the CLE signal 320 are at a logic LOW level.

Similarly, the second OR gate 310 receives the CEN signal 315 as the first input and an ALE signal 330 as the second input, and generates a second combined signal 335 (CAC<1>). The second combined signal 335 is at a logic HIGH level when either the CEN signal 315 or the ALE signal 330 are at a logic HIGH level. The second combined signal 335 is at a logic LOW level when both the CEN signal 315 and the ALE signal 330 are at a logic LOW level. The CEN signal 315 is similar to the CEN signal 210, the CLE signal 320 is similar to the CLE signal 220, the ALE signal 330 is similar to the ALE signal 215, the first combined signal 325 is similar to the first combined signal 260, and the second combined signal 335 is similar to the second combined signal 265 of FIG. 2. Thus, the encoder 300 converts (e.g., encodes) the CEN signal 315, the CLE signal 320, and the ALE signal 330 into the first combined signal 325 and the second combined signal 335.

The first combined signal 325 and the second combined signal 335 may be generated by the encoder 300 in accordance with Truth Table 3 below:

| Truth Table 3 | | | | | |
| --- | --- | --- | --- | --- | --- |
| CEN | CLE | ALE | CAC<0> | CAC<1> | OPERATION |
| 0 | 0 | 0 | 0 | 0 | DATA |
| 0 | 0 | 1 | 0 | 1 | ADDRESS |
| 0 | 1 | 0 | 1 | 0 | COMMAND |
| 1 | X | X | 1 | 1 | DISABLE |
| 0 | 1 | 1 | INVALID | INVALID | |

As seen from the Truth Table 3 above, when the CEN signal 315 is not asserted (e.g., is at a logic "1" or HIGH level), the first combined signal 325 and the second combined signal 335 are disabled regardless of the state of the CLE signal 320 and the state of the ALE signal 330. In some embodiments, when the first combined signal 325 and the second combined signal 335 are both at logic HIGH levels, the memory controller (e.g., the memory controller 200) does not send the first combined signal and the second combined signal to the memory module (e.g., the memory module 205). In other embodiments, the memory module may simply ignore the first combined signal 325 and the second combined signal 335 that are both at a logic HIGH level.

Further, an invalid event occurs when the CEN signal 315 is asserted (e.g., is at a logic "0" or LOW level), and both the CLE signal 320 and the ALE signal 330 are at a logic HIGH level. The memory controller (e.g., the memory controller 200) handles the invalid event internally and does not transmit the first combined signal 325 and the second combined signal 335 to the memory module (e.g., the memory module 205). When the CEN signal 315 is asserted (e.g., is at logic "0" or LOW level) and at least one of the CLE signal 320 and the ALE signal 330 is at a logic LOW level, the first combined signal 325 and the second combined signal 335 are generated by a logical OR operation between the CEN signal and the CLE signal (for the first combined signal) and between the CEN signal and the ALE signal (for the second combined signal).

Although the encoder 300 is shown as having the first OR gate 305 and the second OR gate 310 to encode the CEN signal 315, the CLE signal 320, and the ALE signal 330 into the first combined signal 325 and the second combined signal 335, in some embodiments, the encoder may apply other logic to encode the CEN signal, the CLE signal, and the ALE signal into the first combined signal and the second combined signal.

Turning now to FIG. 4, an example logic diagram of a decoder 400 is shown, in accordance with some embodiments of the present disclosure. The decoder 400 is associated with a memory module (e.g., the memory module 205) and is similar to the decoder 290 of FIG. 2. The decoder 400 is configured to receive two encoded signals from the encoder (e.g., the encoder 300) and decode those signals into three signals. Thus, in some embodiments, the decoder 400 includes a logic AND gate 405, a first buffer 410, and a second buffer 415. The AND gate implements a logical conjunction on two input signals to generate one output signal. The AND gate 405 operates in accordance with Truth Table 4 below:

| Truth Table 4 | | |
| --- | --- | --- |
| INPUT A | INPUT B | OUTPUT |
| 0 | 0 | 0 |
| 0 | 1 | 0 |

-continued

Truth Table 4

| INPUT A | INPUT B | OUTPUT |
|---------|---------|--------|
| 1 | 0 | 0 |
| 1 | 1 | 1 |

Thus, the AND gate 405 outputs a logic HIGH level (e.g., logic level "1") only when all the inputs to the AND gate are also at a logic HIGH level. If any of the inputs to the AND gate 405 is at a logic LOW level (e.g., logic level "0"), the output of the AND gate is a logic LOW level. Specifically, the AND gate 405 receives a first combined signal 420 and a second combined signal 425 as inputs to generate a CEN signal 430 as output. The first combined signal 420 is the same as the first combined signal 325 that is generated by the encoder 300, while the second combined signal 425 is same as the second combined signal 335 that is generated by the encoder. The CEN signal 430 is at a logic HIGH level when both the first combined signal 420 and the second combined signal 425 are also at a logic HIGH level, while the CEN signal is at a logic LOW level when either of the first combined signal or the second combined signal is at a logic LOW level. Further, the decoded CEN signal (e.g., the CEN signal 430) has similar attributes as the encoded CEN signal (e.g., the CEN signal 315). For example, the CEN signal 430 has the same or substantially similar duty cycle as the CEN signal 315. Similarly, and like the CEN signal 315, the CEN signal 430 is an active low signal, and so on. The CEN signal 430 is analogous to the CEN signal 295A of FIG. 2.

The first buffer 410 and the second buffer 415 are each configured to receive a single input and generate a single output. The first buffer 410 and the second buffer 415 are configured to pass the input to the output unchanged, as shown in Truth Table 5 below:

Truth Table 5

| INPUT | OUTPUT |
|-------|--------|
| 0 | 0 |
| 1 | 1 |

Thus, each of the first buffer 410 and the second buffer 415 output a logic LOW level if the input is a logic LOW level, and output a logic HIGH level when the input is a logic HIGH level. The first buffer 410 receives the first combined signal 420 as the input and generates a CLE signal 435 as the output. The CLE signal 435 is at a logic HIGH level when the first combined signal 420 is at a logic HIGH level and the CLE signal is at a logic LOW level when the first combined signal is at a logic LOW level. The decoded CLE signal (e.g., the CLE signal 435) is same or substantially similar as the encoded CLE signal (e.g., the CLE signal 320). Thus, the CLE signal 435 has the same or substantially similar attributes as the CLE signal 320. Further, the CLE signal 435 is analogous to the CLE signal 295C of FIG. 2.

The second buffer 415 receives the second combined signal 425 as input and generates an ALE signal 440 as the output. The ALE signal 440 is at a logic HIGH level when the second combined signal 425 is at a logic HIGH level and the ALE signal is at a logic LOW level when the second combined signal 425 is at a logic LOW level. The decoded ALE signal (e.g., the ALE signal 440) is same or substantially similar as the encoded ALE signal (e.g., the ALE signal 330). Thus, the ALE signal 440 has the same or substantially similar attributes as the ALE signal 330. Further, the ALE signal 440 is analogous to the ALE signal 295B of FIG. 2.

Thus, the decoder 400 converts the first combined signal 420 and the second combined signal 425 back into the CEN signal 430, the CLE signal 435, and the ALE signal 440. The decoding by the decoder 400 may be in accordance with the Truth Table 3 above. For example, when the first combined signal 420 is at a logic LOW level and the second combined signal 425 is at a logic HIGH level, the decoder 400 generates the CEN signal 430 at a logic LOW level, the CLE signal 435 at a logic LOW level, and the ALE signal 440 at a logic HIGH level. When the first combined signal 420 is at a logic HIGH level and the second combined signal 425 is at a logic LOW level, the decoder 400 generates the CEN signal 430 at a logic LOW level, the CLE signal 435 at a logic HIGH level, and the ALE signal 440 at a logic LOW level. When the first combined signal 420 is at a logic LOW level and the second combined signal 425 is also at a logic LOW level, the decoder 400 generates the CEN signal 430 at a logic LOW level, the CLE signal 435 at a logic LOW level, and the ALE signal 440 at a logic LOW level.

Further, the decoder 400 is configured to apply the logic in the AND gate 405, the first buffer 410, and the second buffer 415 simultaneously or substantially simultaneously such that the first combined signal 420 and the second combined signal 425 are decoded simultaneously or substantially simultaneously to generate the CEN signal 430, the CLE signal 435, and the ALE signal 440 simultaneously or substantially simultaneously.

By virtue of decoding the first combined signal 420 and the second combined signal 425 simultaneously or substantially simultaneously to generate the CEN signal 430, the CLE signal 435, and the ALE signal 440 simultaneously or substantially simultaneously, the associated memory module (e.g., the memory module 205) receives the CEN signal, the CLE signal, and the ALE signal simultaneously or substantially simultaneously to eliminate or substantially eliminate the time lag between assertion of the CEN signal and the receipt of the CLE/ALE signals. Although the decoder 400 has been shown as having the AND gate 405, the first buffer 410, and the second buffer 415, in some embodiments, the decoder may apply other logic so long as the decoder decodes the first combined signal and the second combined signal to obtain the CEN signal 430, the CLE signal 435, and the ALE signal 440, as discussed herein.

Figure 5:
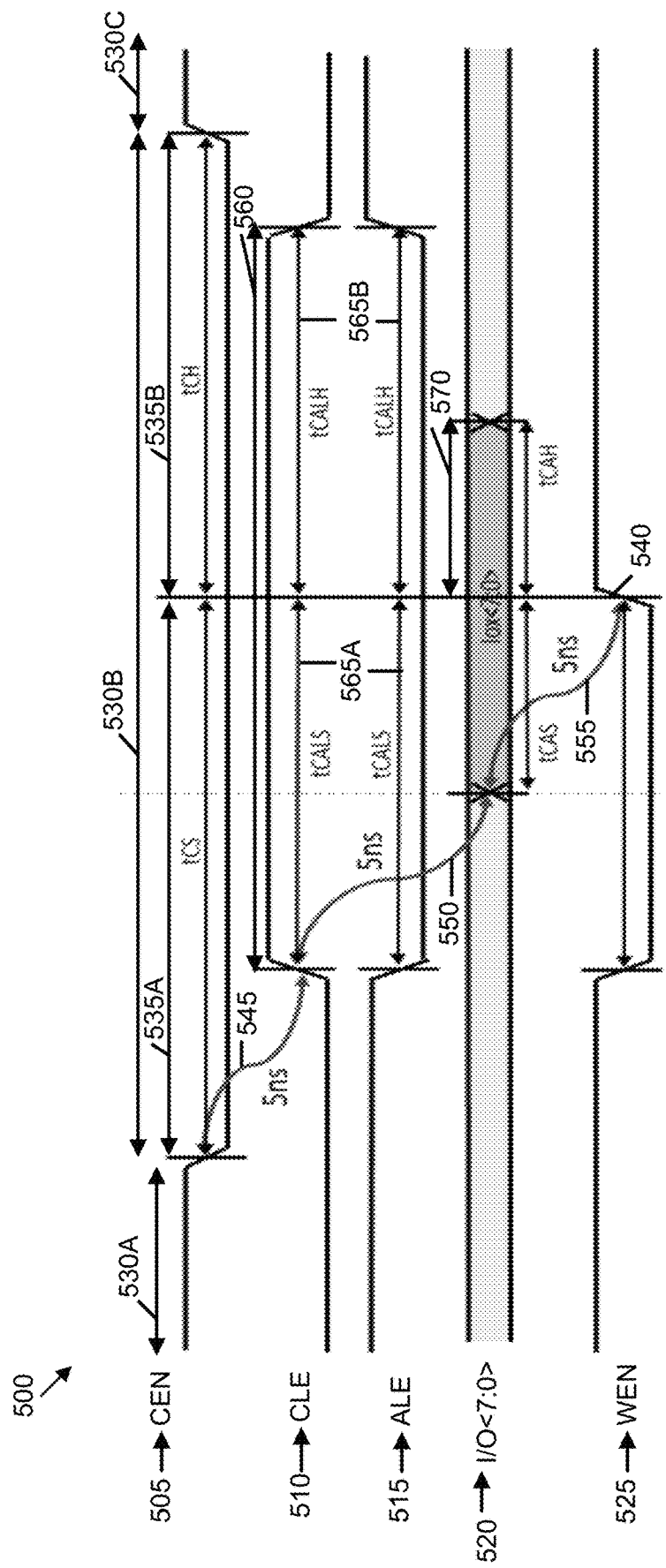
FIG. 5 is an example timing diagram showing a setup time in a conventional communication between the memory controller and the memory module.

Referring now to FIG. 5, a timing diagram 500 of a conventional memory module for performing a write operation is shown. The timing diagram 500 includes a CEN signal 505, a CLE signal 510, an ALE signal 515, an I/O signal 520, and a write enable ("WE") signal 525. In some embodiments, each of the CEN signal 505, the CLE signal 510, the ALE signal 515, and the WE signal 525 may be one-bit wide signals, while the I/O signal 520 may be eights-bits in width. The WE signal 525 is a clock signal that is generated by the memory controller (e.g., the memory controller 200) to write data to an address of the memory module (e.g., the memory module 205). In some embodiments, the WE signal 525 is an active low signal.

To activate a memory module, the memory controller asserts the CEN signal 505. Since the CEN signal 505 is an active low signal, the CEN signal is at a logic HIGH level by default as shown during time period 530A. When a memory module is desired to be activated, the memory controller toggles the CEN signal 505 to a logic LOW level. The CEN signal 505 remains in the logic LOW level until the operation being performed in the memory module is complete. For example, the CEN signal 505 remains in the logic LOW level for a time period 530B. Once the operation being performed in the memory module is complete, the memory controller toggles the CEN signal back to the default state of logic HIGH level, as indicated by time period 530C. Further, the time period 530B during which the CEN signal 505 is asserted includes a total chip setup period (tCS) 535A and a total chip hold period (tCH) 535B. The total chip setup period 535A is the total setup time between asserting the memory module and latching of the bits being sent on the I/O signal 520 in a register of the memory module. The total chip hold period 535B is the time period for which the CEN signal continues to be asserted to ensure that bits being sent via the I/O signal 520 are fully latched in the register of the memory module.

The total chip setup period 535A may be known to the memory controller. Thus, the memory controller may wait for the total chip setup period 535A before toggling the WE signal 525 to a rising edge 540. At the rising edge 540 of the WE signal 525, the I/O bits being sent via the I/O signal 520 are latched in a register of the memory module. The total chip setup period 535A is a sum of a first setup time 545, a second setup time 550, and a third setup time 555. Specifically, once the CEN signal 505 is asserted (e.g., goes to a logic LOW level), the CLE signal 510 and the ALE signal 515 are asserted. In other words, once the memory module is activated by the CEN signal 505 going to a logic LOW level, there is a first time lag to activate the CLE and ALE receiver pads on the memory module and receive the CLE signal 510 and the ALE signal 515. This first time lag is shown as the first setup time 545. In some embodiments, the first setup time 545 may be about five nanoseconds. In other embodiments, the first setup time 545 may be greater than or less than about five nanoseconds.

Further, as shown in FIG. 5, upon activation of the ALE/CLE receiver pads and receiving the CLE signal 510 and the ALE signal 515 at the memory module, the CLE signal 510 is at a logic HIGH level during time period 560, while the ALE signal 515 is a logic LOW level during the same time period. Thus, as seen from the Truth Table 1 above, the combination of the CLE signal 510 and the ALE signal 515 is indicative of the memory controller sending a command during the time period 560. The time period 560 may be divided into a total command address latch setup (tCALS) period 565A and a total command address latch hold (tCALH) period 565B. The total command address latch setup period 565A is the total setup time from when the memory module receives the CLE signal 510 and the ALE signal 515 to the latching of the bits sent on the I/O signal 520 at the rising edge 540 of the WE signal 525. In some embodiments, the total command address latch setup period 565A is about ten nanoseconds. In other embodiments, the total command address latch setup period 565A may be greater than or less than ten nanoseconds. The total command address latch setup period 565A is a sum of the second setup time 550 and the third setup time 555. The total command address latch hold period 565B is the time period for which the CLE/ALE receiver pads are continued to be asserted or activated after the rising edge 540 to ensure that the bits being sent via the I/O signal 520 are fully latched in a register of the memory module.

The bits (e.g., command codes, data values, address values) are sent via the I/O signal 520. The I/O receiver pad is activated after the activation of the CLE/ALE receiver pads. Thus, there is a second time lag, also called the second setup time 550, between activation of the CLE/ALE receiver pads and activation of the I/O receiver pad. Once the I/O receiver pad is activated, the bits being sent on the I/O signal 520 may be latched within a register of the memory module at the rising edge 540 of the WE signal 525. In some embodiments, the second setup time 550 may be about five nanoseconds. In other embodiments, the second setup time 550 may be greater than or less than about five nanoseconds. Additionally, there is a third time lag between activation of the I/O receiver pad of the I/O signal 520 and the rising edge 540 of the WE signal 525 at which the bits on the I/O signal are latched in the register. This third time lag is the total command address setup (tCAS) period and is called the third setup time 555. In some embodiments, the third setup time 555 may be about five nanoseconds. In other embodiments, the third setup time 555 may be greater than or less than about five nanoseconds. Once the rising edge 540 of the WE signal 525 is received, the I/O receiver pad continues to be activated for a total command address hold (tCAH) time 570 to ensure that the bits on the I/O signal 520 are fully latched in the register of the memory module.

Thus, the total chip setup period 535A is the time period between the assertion of the CEN signal 505 and the rising edge 540 of the WE signal 525, and is equal to the sum of the first setup time 545, the second setup time 550, and the third setup time 555. When the first setup time 545, the second setup time 550, and the third setup time 555 are each about five nanoseconds, the total chip setup period 535A in a conventional chip is equal to about fifteen nanoseconds. The total chip setup period 535A may also be considered equal to the sum of the first setup time 545 and the total command address latch setup period 565A. The total chip setup period 535A may be reduced by encoding and decoding to eliminate or substantially reduce the first setup time 545.

Figure 6:
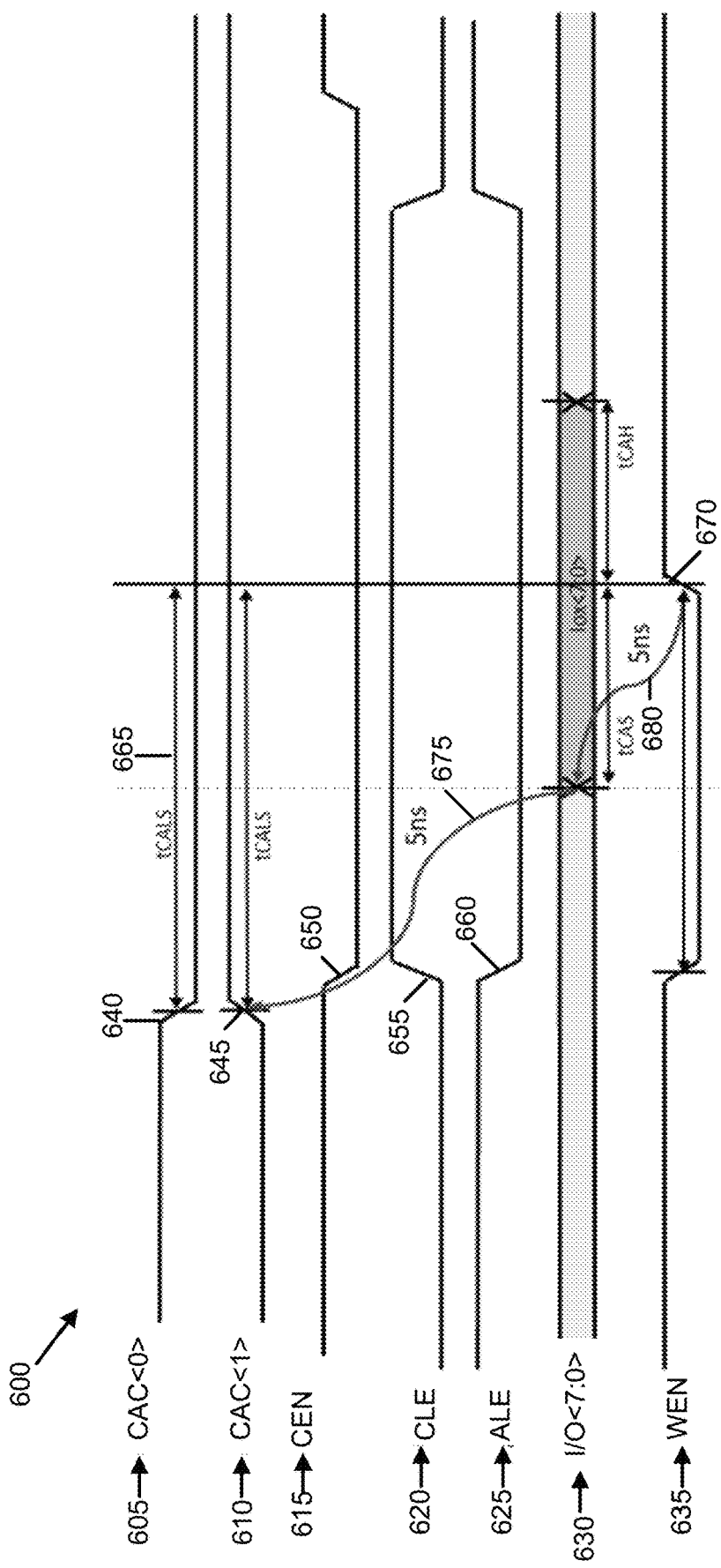
FIG. 6 is an example timing diagram showing the setup time in a communication between the memory controller and the memory module of FIG. 2, in accordance with some embodiments of the present disclosure.

Turning now to FIG. 6, an example timing diagram 600 for performing a write operation is shown, in accordance with some embodiments of the present disclosure. The timing diagram 600 is discussed in conjunction with FIGS. 2-4. The timing diagram 600 includes a first combined signal 605, a second combined signal 610, a CEN signal 615, a CLE signal 620, an ALE signal 625, an I/O signal 630, and a WE signal 635. As discussed above, when the memory controller 200 desires to communicate with the memory module 205, the memory controller generates the first combined signal 605 and the second combined signal 610 by encoding CEN, CLE, and ALE signals that would otherwise have been sent separately to the memory module. The first combined signal 605 and the second combined signal 610 are decoded (e.g., via the decoder 290) at the memory module 205 to generate the CEN signal 615, the CLE signal 620, and the ALE signal 625 simultaneously or substantially simultaneously.

Thus, as shown in the timing diagram 600, the memory module 205 receives the first combined signal 605 at a logic HIGH level and the second combined signal 610 at a logic LOW level. The decoder 290 decodes the first combined signal 605 and the second combined signal 610, indicated by either a toggling edge 640 of the first combined signal or a toggling edge 645 of the second combined signal, or both toggling edges, to generate the CEN signal 615, the CLE signal 620, and the ALE signal 625. In accordance with the Truth Table 3 above, the CEN signal 615 is at a logic LOW level, the CLE signal 620 is at a logic HIGH level, and the ALE signal 625 is at a logic LOW level, indicative of sending a command by the memory controller 200 to the memory module 205. Further, as seen from the toggling edges 640, 645, as well as toggling edges 650, 655, and 660, the first combined signal 605 and the second combined signal 610 are decoded simultaneously or substantially simultaneously to generate the CEN signal 615, the CLE signal 620, and the ALE signal 625 simultaneously or substantially simultaneously. Further, by decoding the first combined signal 605 and the second combined signal 610, and generating the CEN signal 615, the CLE signal 620, and the ALE signal 625 simultaneously or substantially simultaneously, the memory module 205 receives the CEN, ALE, and CLE signals at the same or substantially similar time.

By receiving the CEN signal 615, the CLE signal 620, and the ALE signal 625 simultaneously or substantially simultaneously, the setup time (e.g., the first setup time 545 of FIG. 5) between the assertion of the CEN signal (e.g., the CEN signal 505) and the receipt of the CLE signal and ALE signal (e.g., the CLE signal 510 and the ALE signal 515) is eliminated or substantially reduced. Thus, the total setup time in the timing diagram 600 is equal to a total command address setup (tCALS) period 665, which is the time period between the decoding of the first combined signal 605 and the second combined signal 610 and a rising edge 670 of the WE signal 635. The rising edge 670 of the WE signal 635 is indicative of latching of bits being sent by the memory controller 200 on the I/O signal 630.

The total command address setup period 665 includes a sum of a first setup time 675 for activating the receiver for the I/O signal 630 in the memory module and a second setup time 680 for latching the bits on the I/O signal at the rising edge 670 of the WE signal 635 after activation of the I/O receiver. In some embodiments, the first setup time 675 is equal to about five nanoseconds and the second setup time 680 is also equal to about five nanoseconds. Thus, in some embodiments, the total command address setup period 665 or the total setup time may be equal to ten nanoseconds, which is a saving of about five nanoseconds from the conventional approach. In other embodiments, the first setup time 675 and/or the second setup time 680 may be greater than or less than about five nanoseconds.

Thus, by virtue of simultaneously or substantially receiving the CEN signal 615, the CLE signal 620, and the ALE signal 625 at the memory module 205, there is no delay (or substantially no delay) between the CEN signal going to a logic LOW level at the toggling edge 650 and the activation of the CLE/ALE receivers at the toggling edges 655 and 660, thereby decreasing the total setup time between the CEN signal assertion and the rising edge 670 of the WE signal 635.

Figure 7:
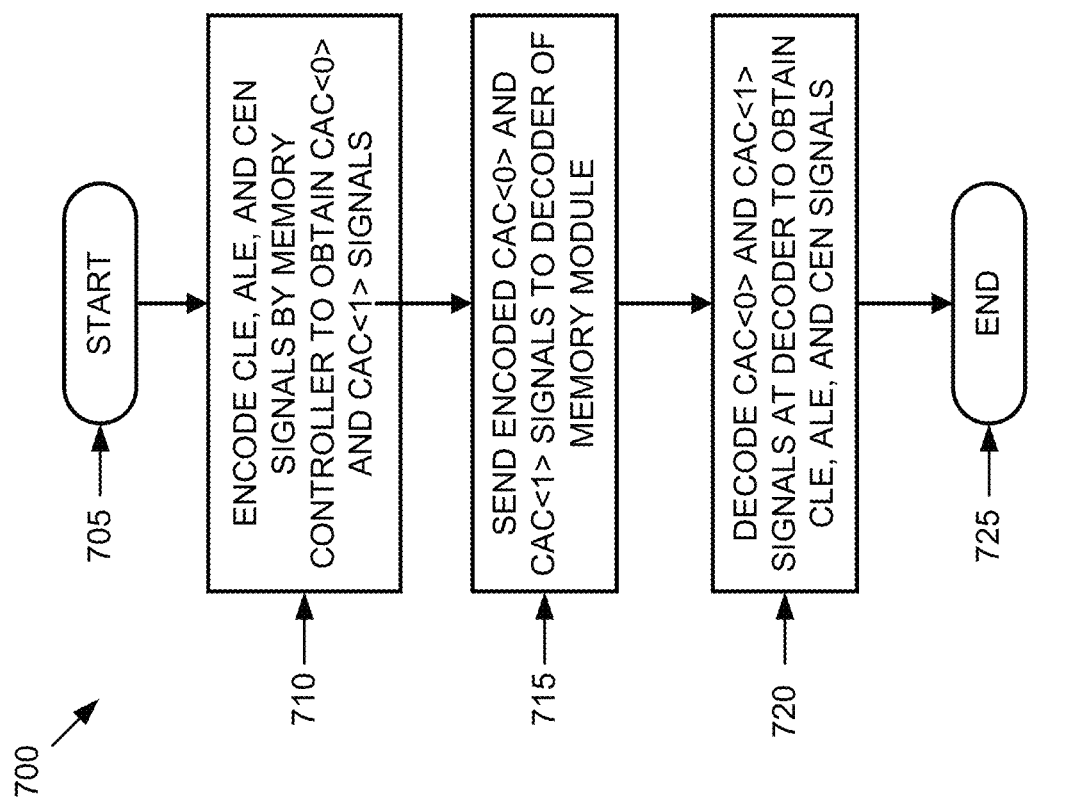
FIG. 7 is an example flowchart outlining operations for facilitating communication between the memory controller and the memory module of FIG. 2, in accordance with some embodiments of the present disclosure.

Referring now to FIG. 7, an example flowchart outlining a process 700 is shown, in accordance with some embodiments of the present disclosure. The process 700 may include additional, other, or different operations depending upon the particular embodiment. The process 700 is discussed in conjunction with FIG. 2. The process 700 starts at operation 705 with the memory controller 200 receiving an instruction from the associated host device (e.g., the host device 105). The instruction may be, for example, to write data to the memory module 205 or read data from the memory module. Upon receiving the instruction, the memory controller 200 generates the CEN signal 210, the ALE signal 215, and the CLE signal 220. Additionally, at operation 710, the memory controller 200 encodes the CEN signal 210, the ALE signal 215, and the CLE signal 220 using the encoder 255 to obtain the first combined signal 260 and the second combined signal 265. For example, the encoder 255 may perform a logic OR operation between the CEN signal 210 and the CLE signal 220 to obtain the first combined signal 260 and another logic OR operation between the CEN signal and the ALE signal 215 to obtain the second combined signal 265.

At operation 715, the memory controller 200 sends the first combined signal 260 and the second combined signal 265 to the decoder 290 of the memory module 205. The decoder 290 decodes the first combined signal 260 and the second combined signal 265 at operation 720 to generate the CEN signal 295A, the ALE signal 295B, and the CLE signal 295C. The CEN signal 295A, the ALE signal 295B, and the CLE signal 295C are generated simultaneously or substantially simultaneously, thereby reducing the setup time between the assertion of the CEN signal 295A and the receipt of the ALE signal 295B/CLE signal 295C. Upon receiving the CEN signal 295A, the ALE signal 295B, and the CLE signal 295C, the memory module 205 performs the requested operation and the process 700 ends at operation 725.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances, where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A non-transitory computer-readable media having computer-readable instructions stored thereon that when executed cause a processor to:
    encode a first chip enable signal, a first address latch enable signal, and a first command latch enable signal to obtain a first combined signal and a second combined signal at a memory controller, wherein the first chip enable signal, the first address latch enable signal, and the first command latch enable signal comprise discrete signals; and
    decode the first combined signal and the second combined signal at a memory module to obtain a second chip enable signal, a second address latch enable signal, and a second command latch enable signal.

2. The non-transitory computer-readable media of claim 1, wherein the computer-readable instructions further comprise instructions to encode the first chip enable signal and the first command latch enable signal to obtain the first combined signal.

3. The non-transitory computer-readable media of claim 2, wherein the computer-readable instructions further comprise instructions to perform a logical OR operation between the first chip enable signal and the first command latch enable signal to obtain the first combined signal.

4. The non-transitory computer-readable media of claim 1, wherein the computer-readable instructions further comprise instructions to encode the first chip enable signal and the first address latch enable signal to obtain the second combined signal.

5. The non-transitory computer-readable media of claim 4, wherein the processor performs a logical OR operation between the first chip enable signal and the first address latch enable signal to obtain the second combined signal.

6. The non-transitory computer-readable media of claim 1, wherein the computer-readable instructions further comprise instructions to decode the first combined signal to obtain the second command latch enable signal by passing the first combined signal through a buffer.

7. The non-transitory computer-readable media of claim 1, wherein the computer-readable instructions further comprise instructions to decode the second combined signal to obtain the second address latch enable signal by passing the second combined signal through a buffer.

8. The non-transitory computer-readable media of claim 1, wherein the computer-readable instructions further comprise instructions to perform a logical AND operation between the first combined signal and the second combined signal to obtain the second chip enable signal.

9. The non-transitory computer-readable media of claim 1, wherein the computer-readable instructions further comprise instructions to transmit data from the memory controller to the memory module when the first combined signal is at a logic LOW level and the second combined signal is at a logic LOW level.

10. The non-transitory computer-readable media of claim 1, wherein the computer-readable instructions further comprise instructions to transmit an address from the memory controller to the memory module when the first combined signal is at a logic LOW level and the second combined signal is at a logic HIGH level.

11. The non-transitory computer-readable media of claim 1, wherein the computer-readable instructions further comprise instructions to transmit a command from the memory controller to the memory module when the first combined signal is at a logic HIGH level and the second combined signal is at a logic LOW level.

12. A method comprising:
    encoding, by a memory controller, a first chip enable signal, a first address latch enable signal, and a first command latch enable signal to obtain a first combined signal and a second combined signal, wherein the first chip enable signal, the first address latch enable signal, and the first command latch enable signal comprise discrete signals;
    receiving, by a memory module, the first combined signal and the second combined signal from the memory controller; and
    decoding, by the memory module, the first combined signal and the second combined signal to obtain a second chip enable signal, a second address latch enable signal, and a second command latch enable signal, wherein upon decoding, the second command latch enable signal and the second address latch enable signal are received substantially simultaneously as the second chip enable signal.

13. The method of claim 12, further comprising transmitting the first combined signal and the second combined signal to the memory module.

14. The method of claim 13, further comprising:
performing, by the memory controller, a logical OR operation between the first chip enable signal and the first command latch enable signal for obtaining the first combined signal; and
performing, by the memory controller, a logical OR operation between the first chip enable signal and the first address latch enable signal for obtaining the second combined signal.

15. The method of claim 12, further comprising:
buffering, by the memory module, the first combined signal for obtaining the second command latch enable signal;
buffering, by the memory module, the second combined signal for obtaining the second address latch enable signal; and
performing, by the memory module, a logical AND operation between the first combined signal and the second combined signal for obtaining the second chip enable signal.

16. The method of claim 12, wherein the first combined signal and the second combined signal are decoded for obtaining the second chip enable signal, the second address latch enable signal, and the second command latch enable signal substantially simultaneously.

17. A memory device comprising:
a memory controller comprising an encoder, wherein the encoder performs:
a first logical OR operation between a first chip enable signal and a first command latch enable signal to obtain a first combined signal; and
a second logical OR operation between the first chip enable signal and a first address latch enable signal to obtain a second combined signal, wherein the first chip enable signal, the first address latch enable signal, and the first command latch enable signal comprise discrete signals; and
a memory module comprising a decoder, wherein the decoder performs:
a first buffer operation on the first combined signal to obtain a second command latch enable signal;
a second buffer operation on the second combined signal to obtain a second address latch enable signal; and
a first logical AND operation between the first combined signal and the second combined signal to obtain a second chip enable signal.

18. The memory device of claim 17, wherein the first buffer operation, the second buffer operation, and the first logical AND operation are performed substantially simultaneously.

19. The memory device of claim 17, wherein the second chip enable signal is received substantially simultaneously as the second command latch enable signal and the second address latch enable signal.

* * * * *